(12) United States Patent
Huntscha et al.

(10) Patent No.: US 10,393,388 B2
(45) Date of Patent: Aug. 27, 2019

(54) CONTROL UNIT FOR A COOKING HOB

(75) Inventors: Mathias Huntscha, Crailsheim (DE); Alwin Neukamm, Whilhermsdorf (DE); Harald Hoffmann, Rothenburg o.d. Tauber (DE); Jurgen Leikam, Hilpoltstein (DE)

(73) Assignee: Electrolux Home Products Corporation N.V., Brussels (BE)

( * ) Notice: Subject to any disclaimer, the term of this patent is extended or adjusted under 35 U.S.C. 154(b) by 1352 days.

(21) Appl. No.: 13/390,390

(22) PCT Filed: Jul. 6, 2010

(86) PCT No.: PCT/EP2010/004022
§ 371 (c)(1),
(2), (4) Date: Feb. 14, 2012

(87) PCT Pub. No.: WO2011/023259
PCT Pub. Date: Mar. 3, 2011

(65) Prior Publication Data
US 2012/0138042 A1    Jun. 7, 2012

(30) Foreign Application Priority Data
Aug. 28, 2009 (EP) .................................. 09011028

(51) Int. Cl.
F24C 7/08        (2006.01)
H05K 5/06       (2006.01)

(52) U.S. Cl.
CPC .............. *F24C 7/083* (2013.01); *H05K 5/061* (2013.01)

(58) Field of Classification Search
CPC ................................ F24C 7/083; H05K 5/061
(Continued)

(56) References Cited

U.S. PATENT DOCUMENTS

2002/0113061 A1* 8/2002 Hammelsbacher .... H05B 3/746
                                                                                   219/506
2004/0118394 A1* 6/2004 Hawkins ............... F24C 15/107
                                                                                   126/215
(Continued)

FOREIGN PATENT DOCUMENTS

EP    1120999    8/2001
EP    1589286    10/2005
(Continued)

OTHER PUBLICATIONS

Machine translation of EP1120999A2, inventor Herzog et al.*
International Search Report for PCT/EP2010/004022, dated Oct. 1, 2010, 3 pages.

*Primary Examiner* — Ibrahime A Abraham
*Assistant Examiner* — John J Norton
(74) *Attorney, Agent, or Firm* — Pearne & Gordon LLP

(57) ABSTRACT

A control unit (10) for a cooking hob has at least one viewing window (24). The control unit (10) is attached or attachable below the viewing window (24) and has a plurality of control elements (12) operable from a top side of the control unit (10). At least one display (14) is arranged on the top side of the control unit (10). A control panel (16) forms an unmovable part of the control unit. A number of elastic elements (30) are for resiliently supporting the display (14) on the control unit (10). The control unit (10) has a display frame (18) for at least partially enclosing the display (14). The display frame (18) includes a sealing lip (28) on its upper side and the elastic elements (30) at its lower side. A cooking hob has at least one control unit (10).

19 Claims, 2 Drawing Sheets

Figure 1:
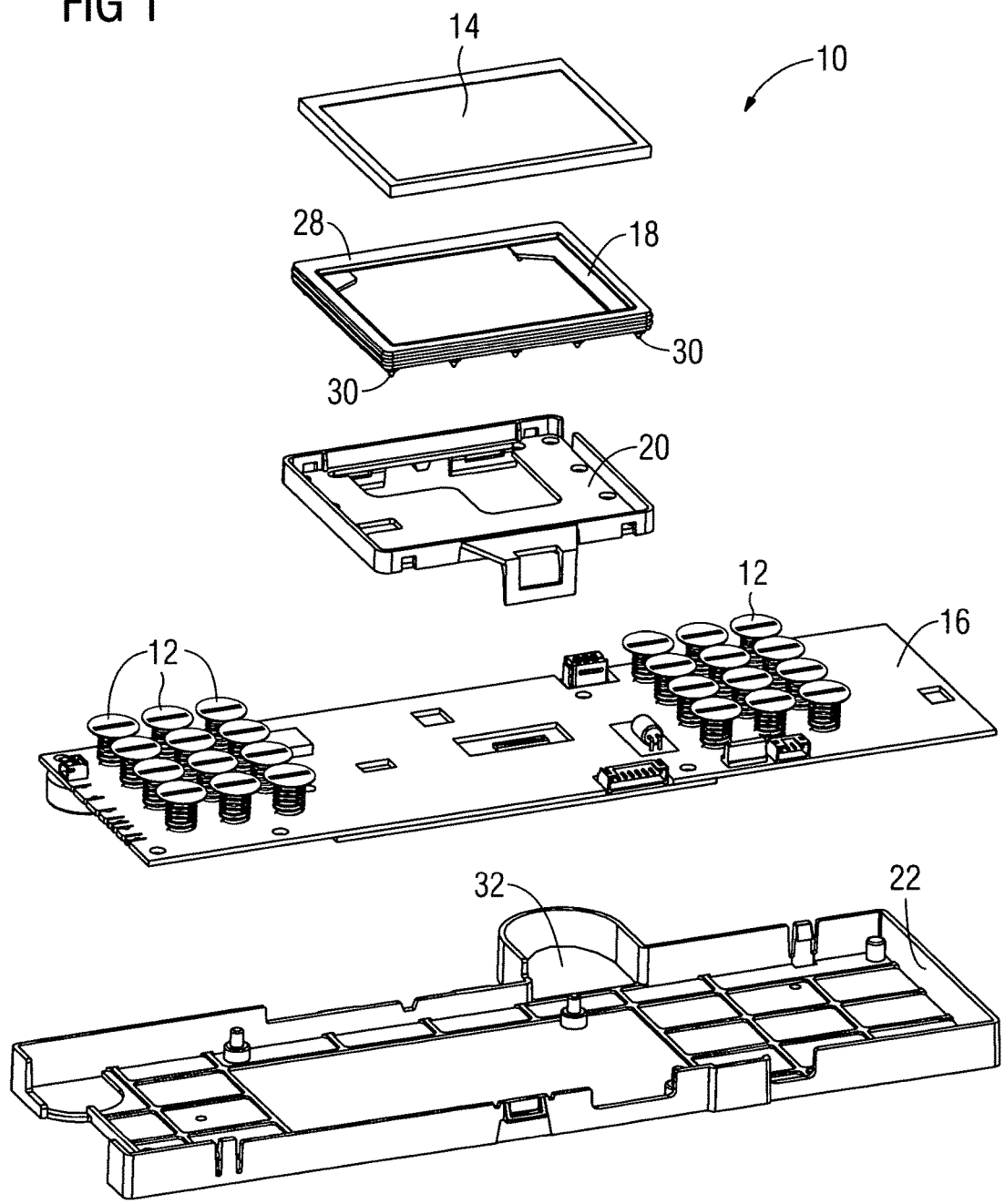

(58) Field of Classification Search
USPC ................ 219/452.11, 452.12, 460.1–462.1;
126/90 A–92 B, 211, 217, 218, 241 A
See application file for complete search history.

(56) References Cited

U.S. PATENT DOCUMENTS

2007/0158094 A1* 7/2007 Burca .................. H01H 9/0235
174/66
2009/0183725 A1 7/2009 Leikam et al.

FOREIGN PATENT DOCUMENTS

| WO | 2007077153 | 7/2007 |
| WO | 2007080046 | 7/2007 |
| WO | 2008056955 | 5/2008 |

* cited by examiner

CONTROL UNIT FOR A COOKING HOB

FIELD

The present invention relates to a control unit for a cooking hob. Further, the present invention relates to a cooking hob with at least one control unit.

BACKGROUND

The control unit of a cooking hob is usually arranged within a casing and pressed against the lower surface of a glass-ceramics panel. Some cooking hobs comprise a display for indicating information. Since the glass-ceramics panel is at least partially transparent, the display may be positioned directly below the glass-ceramics panel. The user can see the display through a viewing window. The viewing window may be formed by a blank portion of the glass-ceramics panel.

The display may be pressed as closely as possible against the lower surface of the glass-ceramics panel in order to obtain a sufficient optical quality. Further, a defined constant distance between the display and the glass-ceramics panel is always required for sufficient optical quality. However, manufacturing tolerances of the components of the cooking hob may cause different heights of an intermediate space provided for receiving the control unit.

Further, dust and other defilements should be prevented from getting into the portion of the viewing window between the glass-ceramics panel and the display. For example, a fan inside the cooking hob may raise dust.

DE 2007 055 310 A1 discloses a cooking hob with a glass-ceramics panel. At the front border of the glass-ceramics panel there is a cutout for receiving a transparent sheet of glass. A casing is arranged below the transparent sheet. A board is arranged within the casing. An electronic control circuit and a display are arranged on the board. The casing is directly or by distance attached at the lower side of the transparent sheet. The board is moveably bedded within the casing. Thus, manufacturing tolerances can be compensated by the moveable casing. The moveable casing is realized by elastic spring elements or by elastic snap-in elements. However, there are no means for preventing dust from getting between the display and the transparent sheet. Further, it is a complex task to connect the transparent sheet to the glass-ceramics panel.

It is an object of the present invention to provide a control unit for a cooking hob with a viewing window, which allows a dust-free intermediate space between the display and the viewing window.

The object of the present invention is achieved by the control unit described herein.

SUMMARY

According to the present invention, the control unit comprises a display frame for enclosing at least partially the display. The display frame includes a sealing lip on its upper side and elastic elements at its lower side.

The present invention involves a combination of the sealing lip and the elastic elements within one element, i.e. the display frame. The sealing lip is pressed or can be pressed against the viewing window and allows a dust-free intermediate space between the display and the viewing window. The elastic elements allow resilient supporting of the display on the control unit, so that manufacturing tolerances can be compensated.

According to a preferred embodiment of the present invention, the display frame is formed as a single-piece part. Preferably, the display frame is made of silicone.

In particular, the control unit is provided for a cooking hob with at least one glass-ceramics panel. The wherein the viewing window forms a part of the glass-ceramics panel. For example, the viewing window is a blank part of the glass-ceramics panel.

Further, the control unit may comprise a display carrier embedding the display frame and the display. The display carrier provides a guard for the display.

According to the preferred embodiment of the present invention, the elastic knobs penetrate through corresponding holes in a bottom side of the display carrier, so that the display carrier, the display frame and the display form a moveable structural unit with the control unit. For example, the display carrier, the display frame and the display are supported on the control panel by the elastic knobs.

Additionally, the display carrier may be attached or attachable on the control panel by at least one snap-in mechanism.

Further, the control unit may comprise an interface casing, in which the control panel is unmovably attached or attachable. Otherwise, the display carrier, the display frame and the display may be moveably attached or attachable within the interface casing.

The object of the present invention is further achieved by the cooking hob described herein.

According to the present invention the cooking hob comprises at least one control unit as described above.

Further, the cooking hob may comprise at least one glass-ceramics panel. The viewing window may form a part of the glass-ceramics panel. In particular, the viewing window may be a blank part of the glass-ceramics panel.

Novel and inventive features of the present invention are set forth in the appended claims.

DETAILED DESCRIPTION OF THE DRAWINGS

Figure 2:
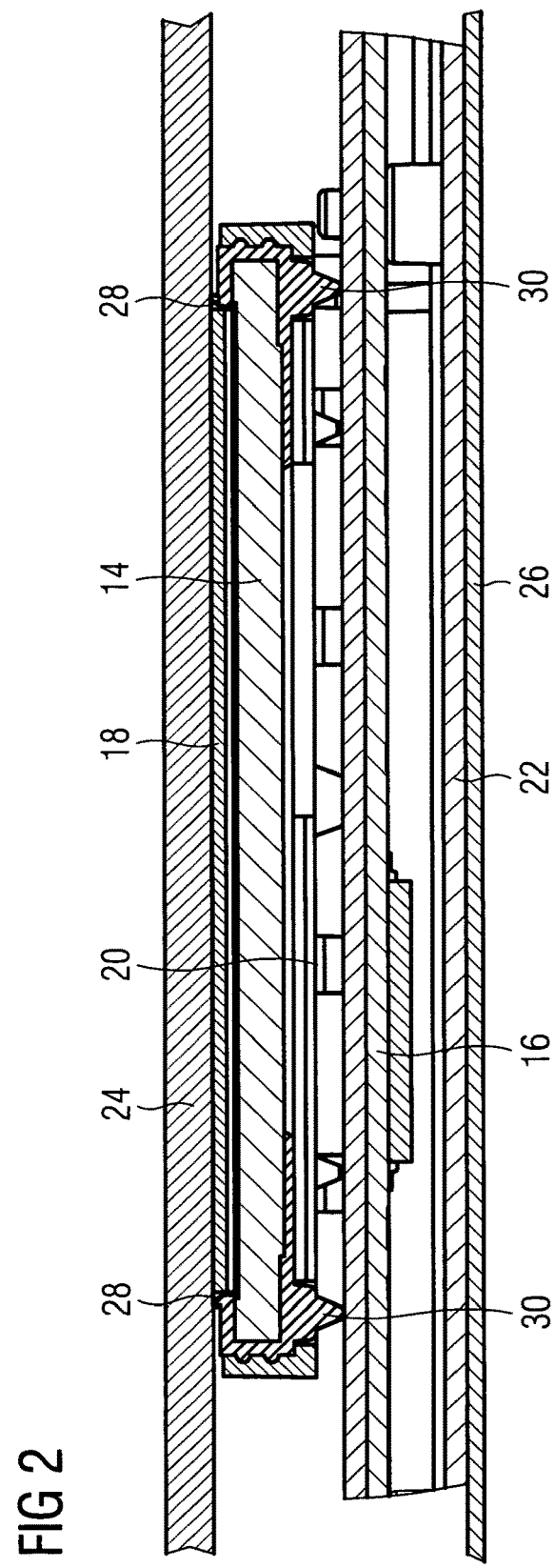

The present invention will be described in further detail with reference to the drawings, in which FIG. 1 illustrates an exploded view of a preferred embodiment of a control unit according to the present invention, and FIG. 2 illustrates a sectional front view of a central portion of the preferred embodiment of the control unit according to the present invention.

FIG. 1 illustrates an exploded view of a preferred embodiment of a control unit 10 according to the present invention. The control unit 10 comprises a display 14, a display frame 18, a display carrier 20, a control panel 16 and an interface casing 22. For example, the display 14 may be TFT screen.

The display frame 18 includes a sealing lip 28 on its upper side and a number of elastic knobs 30 at its lower side. On the control panel 16, a plurality of control elements 12 is arranged. The control panel 16 is formed as a board for electronic elements.

The display frame 18 is provided for receiving the display 14, so that the display frame 18 encloses circumferentially the display 14. The outer portions of both large-area sides of the display 14 are also covered by the display frame 18.

The display carrier 20 is provided for receiving the display frame 18 and the display 14, so that the display frame 18 with the display 14 is embedded within said display carrier 20. The sealing lip 28 of the display frame 18 is provided for sealing the intermediate space between the display 14 and a viewing window and/or a glass-ceramics panel.

The interface casing 22 is provided for receiving the control panel 16. The interface casing 22 comprises a convexity 32 at its side wall. The convexity 32 is provided for receiving a ferrite element. The ferrite element can be used as a suppression shielding of an electromagnetic field.

The display carrier 20 comprises a number of holes on its bottom side, so that the elastic knobs 30 can penetrate through the bottom side of the display carrier 20. The elastic knobs 30 are provided to elastically support the display carrier 20, with the display frame 18 and the display 14 on the upper side of the control panel 16. The display carrier 20 can be fixed on the upper side of the control panel 16 within the interface casing 22 by a snap-in mechanism. The elastic knobs 30 allow a resilient bearing of the display carrier 20 with the display frame 18 and the display 14.

In this example, the display frame 18 is a single-piece part and is made of silicone. The silicone allows a sufficient resilience of the sealing lip 28 and of the knobs 30.

FIG. 2 illustrates a sectional front view of a central portion of the control unit 10 according to the present invention. The control unit 10 is shown in a mounted state and arranged between a glass-ceramics panel 24 and a support panel 26.

The glass-ceramics panel 24 and the support panel 26 are aligned horizontally and parallel to each other. The support panel 26 is disposed at a distance below the glass-ceramics panel 24. For example, the support panel 26 may be a spool carrier or a part of a holding frame fixed at the glass-ceramics panel 24.

The control unit 10 includes the display 14, the display frame 18, the display carrier 20, the control panel 16 and the interface casing 22. The display 14 is embedded within the display frame 18. In turn, the display frame 18 with the display 14 is embedded within the display carrier 20.

The display 14, the display frame 18 and the display carrier 20 form a structural unit, which is moveably positioned between the glass-ceramics panel 24 and the control panel 16. On the upper side of said structural unit, the sealing lip 28 is pressed against the glass-ceramics panel 24. At the lower side of said structural unit, the elastic knobs 30 rest on the control panel 16. Thus, the structural unit is resiliently positioned between the glass-ceramics panel 24 and the control panel 16.

The elastic knobs 30 allow a resilient bearing of the structural unit, including the display 14, the display frame 18 and the display carrier 20. The elastic knobs 30 are able to compensate for manufacturing tolerances of the components of the control unit 10. The sealing lip 28 of the display frame 18 allows a dust-free intermediate space between the display 14 and the glass-ceramics panel 24.

Although the above described control unit is provided for a cooking unit with a glass-ceramics panel, in general, the inventive cooking hob is suitable for an arbitrary cooking hob with at least one viewing window.

Although illustrative embodiments of the present invention have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

The invention claimed is:

1. A control unit for a cooking hob with at least one viewing window, said control unit is attached or attachable below said viewing window and comprises:

a plurality of control elements operable from a top side of the control unit, at least one display arranged on the top side of the control unit, a control panel forming an unmoveable part of the control unit, and a plurality of elastic elements for resiliently supporting the display on the control unit, wherein the control unit comprises a display frame extending around a plurality of side walls of the at least one display for enclosing at least partially the display, and the display frame is formed as a single-piece part and includes the plurality of elastic elements at a lower side, and a sealing lip on an upper side that is directly in contact with the display, and wherein the plurality of elastic elements are positioned between the display and the control panel, the sealing lip positioned between an upper surface of the at least one display and a bottom surface of the at least one viewing window to position the at least one display a predetermined distance from the at least one viewing window.

2. The control unit according to claim 1, wherein the display frame is made of silicone.

3. The control unit according to claim 1, wherein the control unit is provided for a cooking hob with at least one glass-ceramics panel, and the viewing window forms a part of said glass-ceramics panel.

4. The control unit according to claim 3, wherein the viewing window is a blank part of said glass-ceramics panel.

5. The control unit according to claim 1, wherein the control unit comprises a display carrier embedding the display frame and the display, wherein the carrier is positioned between the display frame and the control panel.

6. The control unit according to claim 5, wherein the elastic elements are knobs that penetrate through corresponding holes in a bottom side of the display carrier, so that the display carrier, the display frame and the display form a moveable structural unit with the control unit.

7. The control unit according to claim 6, wherein the display carrier, the display frame and the display are supported on a same side of the control panel by the elastic knobs.

8. The control unit according to claim 5, wherein the display carrier is attached or attachable on the control panel by at least one snap-in mechanism.

9. The control unit according to claim 1, wherein the control unit comprises an interface casing, in which the control panel is unmovably attached or attachable.

10. The control unit according to claim 9, wherein the display carrier, the display frame and the display are moveably attached or attachable within the interface casing.

11. The control unit according to claim 1, wherein the plurality of elastic elements bias the display frame towards the at least one viewing window.

12. The control unit according to claim 1, wherein the plurality of elastic elements bias the display frame towards the display.

13. The control unit according to claim 1, wherein the plurality of elastic elements are under the display frame.

14. The control unit according to claim 1, wherein the sealing lip and the plurality of elastic elements are a single piece.

15. A cooking hob comprising at least one viewing window and at least one control unit of claim 1 positioned below the viewing window.

16. The cooking hob according to claim 15, wherein the cooking hob comprises at least one glass-ceramics panel, wherein a viewing window forms a part of said glass-ceramics panel.

17. The cooking hob according to claim 16, wherein the viewing window is a blank part of said glass-ceramics panel.

18. A control unit for a cooking hob, the cooking hob comprising a panel extending over the control unit, the control unit attached or attachable to a lower surface of the panel and comprising:

a control panel for receiving electronic components, at least one display positioned between the lower surface of the panel and an upper surface of the control panel; and a display frame extending around a plurality of side walls of the at least one display for positioning the at least one display a first predetermined distance above the control panel and a second predetermined distance below the lower surface of the panel, the display frame comprising a lower side of the display frame disposed between the at least one display and the control panel for positioning the at least one display the first predetermined distance above the control panel, and a sealing lip on an upper side of the display frame, the sealing lip extending about a periphery of the at least one display and disposed between the upper surface of the at least one display and the lower surface of the panel for positioning the at least one display the second predetermined distance below the lower surface of the panel and defining a sealed area between the lower surface of the panel and the upper surface of the at least one display.

19. The control unit according to claim 18, the display frame further comprising:

a plurality of elastic elements extending from the lower side of the display frame.

* * * * *